(12) United States Patent
Radtke (10) Patent No.: US 12,164,070 B2
(45) Date of Patent: Dec. 10, 2024

(54) SILICON PHOTOMULTIPLIERS REFLECTIVE PULSE COMPRESSION

(71) Applicant: Thorlabs, Inc., Newton, NJ (US)

(72) Inventor: Bill Radtke, Ellicott City, MD (US)

(73) Assignee: Thorlabs, Inc., Newton, NJ (US)

( * ) Notice: Subject to any disclaimer, the term of this patent is extended or adjusted under 35 U.S.C. 154(b) by 463 days.

(21) Appl. No.: 17/514,581

(22) Filed: Oct. 29, 2021

(65) Prior Publication Data
US 2022/0137244 A1 May 5, 2022

Related U.S. Application Data

(60) Provisional application No. 63/109,723, filed on Nov. 4, 2020.

(51) Int. Cl.
*G01T 1/24* (2006.01)
*G01J 1/44* (2006.01)
(Continued)

(52) U.S. Cl.
CPC ............... *G01T 1/248* (2013.01); *G01J 1/44* (2013.01); *G01J 11/00* (2013.01);
(Continued)

(58) Field of Classification Search
CPC . G01T 1/248; H01L 31/107; H01L 31/02027; G01J 1/44; G01J 2001/442; G01J 2001/4466; G01J 2001/4453; G01J 11/00
See application file for complete search history.

(56) References Cited

U.S. PATENT DOCUMENTS 5,046,139 A 9/1991 Kahn
6,218,657 B1 4/2001 Bethune et al.
(Continued)

FOREIGN PATENT DOCUMENTS

CN 1116470 A 2/1996
CN 101288229 A 10/2008
(Continued)

OTHER PUBLICATIONS

Dance, J. B., Pulse Shaping in Nuclear Amplifiers, Instrument Practice, Jan. 1968, pp. 57-64, vol. 22, No. 1.
(Continued)

*Primary Examiner* — Jennifer D Bennett
*Assistant Examiner* — Erin R Garber
(74) *Attorney, Agent, or Firm* — Myers Wolin, LLC (57) ABSTRACT

A photon detection device including: a silicon photomultiplier (SiPM) configured to generate a detected signal when the SiPM absorbs a photon; an amplifier; and a transmission line stub between the SiPM and amplifier input. The SiPM connection is configured to transmit the detected signal to the amplifier and a transmission line stub is also configured to receive the SiPM signal and generate a time-delayed reflected signal back into the amplifier input; wherein the amplifier is configured to amplify a combination of the detected signal and the time-delayed reflected signal. The end of the transmission line stub is terminated with a complex impedance that can simultaneously absorb some components of the SiPM pulse response, and reflect others.

6 Claims, 13 Drawing Sheets

(51) Int. Cl.
*G01J 11/00* (2006.01)
*H01L 31/02* (2006.01)
*H01L 31/107* (2006.01)

(52) U.S. Cl.
CPC ...... *H01L 31/02027* (2013.01); *H01L 31/107* (2013.01); *G01J 2001/442* (2013.01); *G01J 2001/4466* (2013.01)

(56) References Cited

U.S. PATENT DOCUMENTS

| | | |
|---|---|---|
| 9,818,064 B1 | 11/2017 | Abdo |
| 2010/0111305 A1 | 5/2010 | Yuan et al. |
| 2014/0183339 A1 | 7/2014 | Dolinsky |
| 2018/0337324 A1 | 11/2018 | Fong et al. |
| 2020/0366381 A1* | 11/2020 | Van Weeren ......... H01L 31/107 |

FOREIGN PATENT DOCUMENTS

| | | |
|---|---|---|
| CN | 102197496 A | 9/2011 |
| CN | 105547470 A | 5/2016 |
| CN | 106537792 A | 3/2017 |
| CN | 106716993 A | 5/2017 |
| CN | 113167875 A | 7/2021 |
| GB | 2466299 A | 6/2010 |
| JP | 2006287307 A | 10/2006 |
| JP | 2012013600 A | 1/2012 |
| RU | 2597668 C1 | 9/2016 |
| WO | 0163803 A1 | 8/2001 |

OTHER PUBLICATIONS

Yebras, J. M., et al., "Strategies for shortening the output pulse of silicon photomultipliers", Optical Engineering, Jul. 6, 2012, pp. 2-8, vol. 51, No. 7, SPIE.

European Search Report with European search opinion issued by The European Patent Office for Application No. 21204975.3, mailed on Apr. 22, 2022.

Yebras et al. "Strategies for shortening the output pulse of silicon photomultipliers", Optical Engineering, Jul. 6, 2012, pp. 1-8, vol. 51, No. 7, SPIE (cited in the CNOA but previously made of record in an IDS filed on May 3, 2022.

First Notification of Office Action issued by the China National Intellectual Property Administration for International Patent Application No. 202111289022.0, dated Feb. 28, 2024, with English translation attached.

* cited by examiner

SILICON PHOTOMULTIPLIERS REFLECTIVE PULSE COMPRESSION

CROSS REFERENCES TO RELATED APPLICATIONS

This application claims the benefit of U.S. Provisional Patent Application No. 63/109,723 filed on Nov. 4, 2020. The disclosure and entire teachings of U.S. Provisional Patent Application 63/109,723 are hereby incorporated by reference.

FIELD OF THE INVENTION

The invention generally relates to photomultipliers. More particularly, the invention relates to silicon photomultipliers (SiPM) with passive quenching and tail compensation using Reflective Pulse Compression (RPC).

BACKGROUND

A silicon photomultiplier (SiPM) device or multipixel photon counter (MPPC) is an array of small avalanche photodiodes (APDs) capable of detecting single photons and having a high gain $>10^6$. However, one non-ideal attribute of SiPM devices is the characteristic recovery time for each APD in the array after it detects a photon. This recovery period creates a pulse-response falling edge "tail", having a relatively longer time constant than the rising edge. The recovery tail shape may even consist of multiple time-constant components or time constants that are temperature dependent, making some matched circuit techniques less effective (such as Pole-Zero cancellation, PZC).

Figure 1:
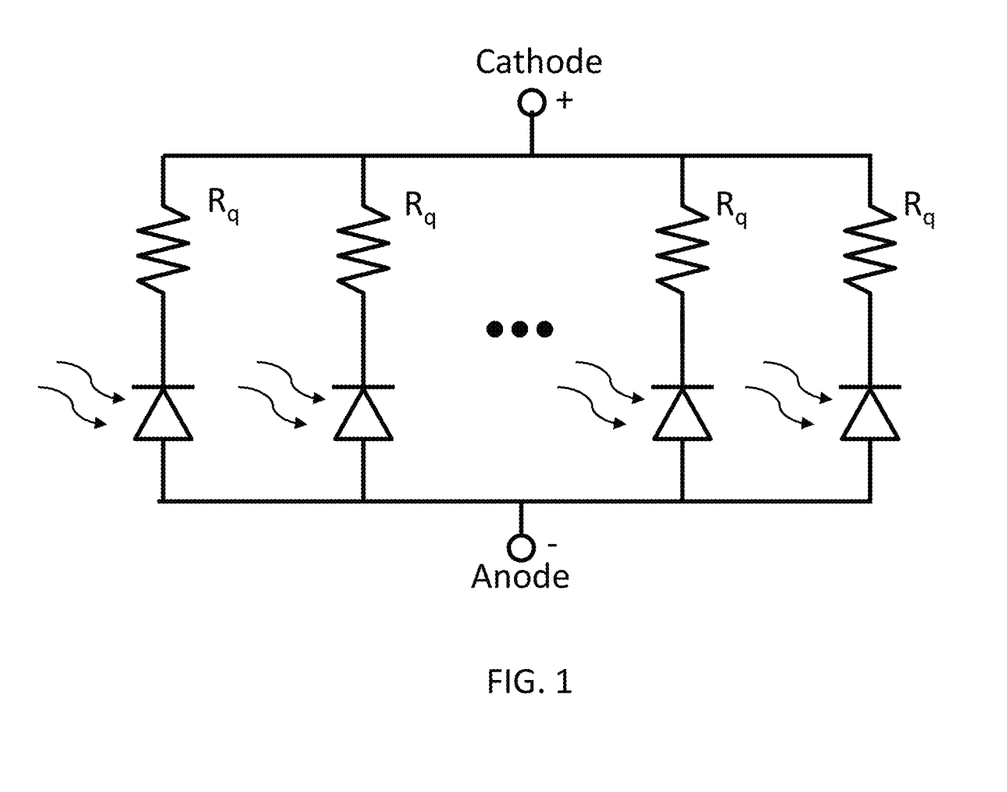
FIG. 1 shows an array of avalanche photodiodes in a SiPM.
Figure 2:
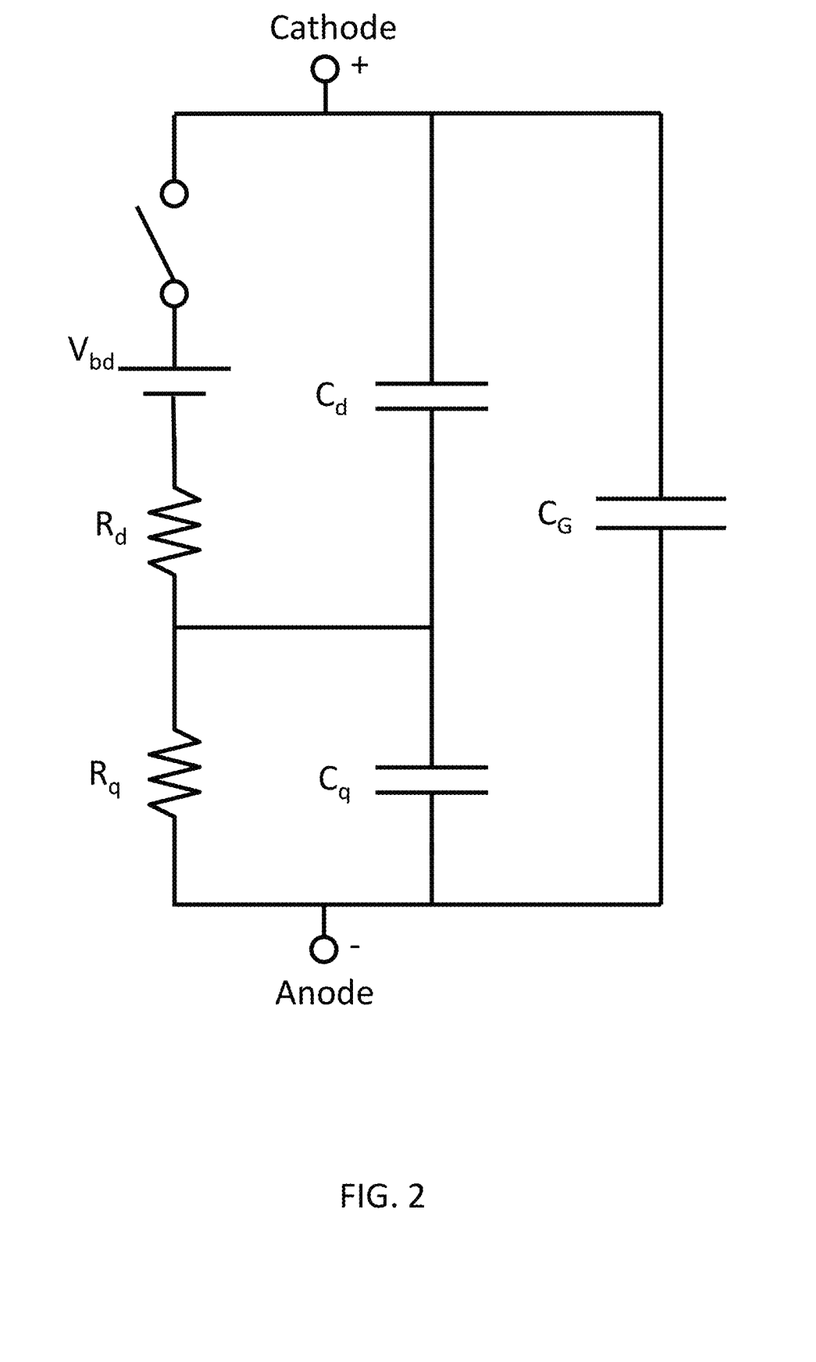
FIG. 2 shows an equivalent circuit of a SiPM APD Cell (Corsi Model).
Figure 3:
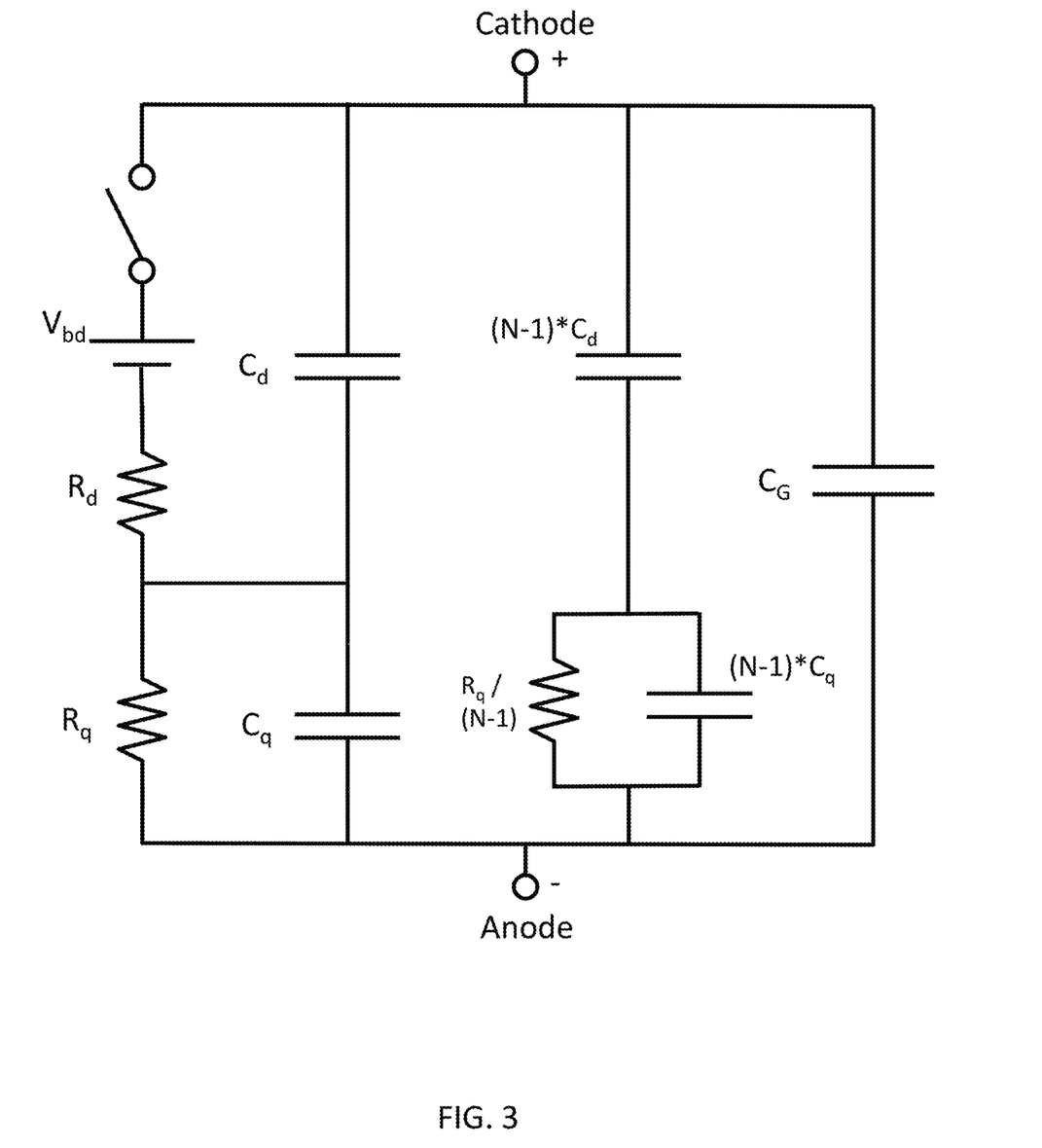
FIG. 3 shows an equivalent circuit of an array of SiPM APD cells constituting a SiPM device.

FIG. 1 shows an array of APD cells connected in parallel to form a typical SiPM detector array. FIG. 2 shows an equivalent circuit model (Corsi model) of a SiPM APD cell, and FIG. 3 shows the equivalent circuit of a device with N SiPM APD cells.

The following general descriptions are concerned with the single-photon operation of a single SiPM APD cell, but are not intended to describe in-depth operation of a SiPM device. Prior to arrival of a photon the switch is open and capacitor $C_d$ is initially charged from $V_{bias}$ as shown in the equivalent circuit in FIG. 2.

An arriving photon causes avalanche current to flow in the SiPM APD cell as simulated by the equivalent circuit switch closing. The capacitor $C_d$ discharges through resistor $R_d$, whose small resistance value provides for a surge in current flow while the potential across the capacitor $C_d$ decays exponentially with time constant $\tau(rise)=R_d C_d$, towards the breakdown voltage $V_{bd}$. The avalanche process is quenched by the voltage drop across quenching resistor $R_q$.

Once the avalanche is quenched, the switch in the equivalent circuit returns to the open state, and the capacitor $C_d$ is recharged through the resistor $R_q$ exponentially to its initial value due to $V_{bias}$. The re-charge time has a time constant of $\tau(fall)=R_q(C_d+C_q)$.

Figure 4:
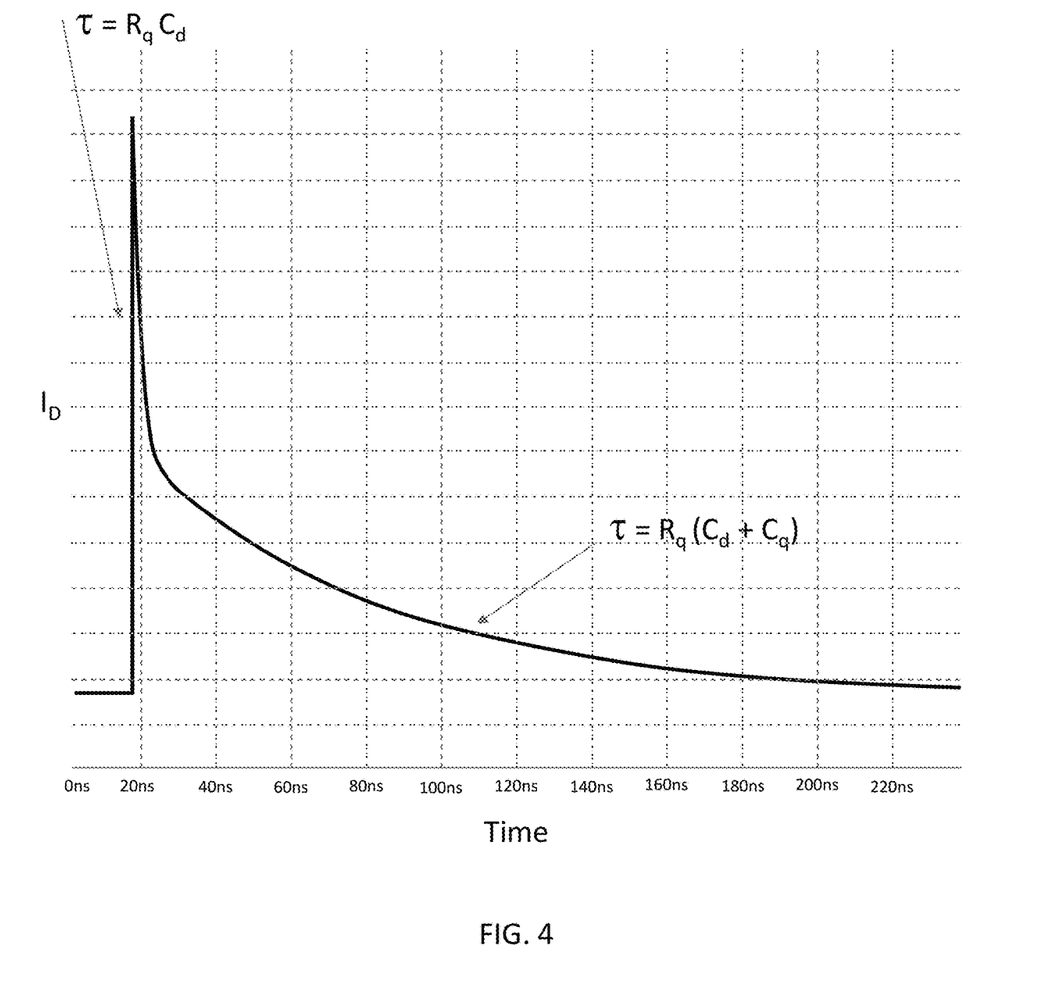
FIG. 4 shows the SiPM uncompensated pulse response.

FIG. 4 shows an output pulse of the described SiPM APD cell operation. In FIG. 4, the pulse has a very fast rising edge when the capacitor $C_d$ is discharged by the avalanching SiPM APD, and a slower trailing edge, the tail, when capacitor $C_d$ and $C_q$ is being recharged.

The recharge process of the capacitor $C_d$ and $C_q$ is commonly known as recovery, and the recovery time depends on the product of the resistance of $R_q$ and capacitance of $C_d$ and $C_q$. During the period of avalanche multiplication and the subsequent recovery time, a SiPM APD cell is unavailable to detect a new photoelectric event.

Figure 5:
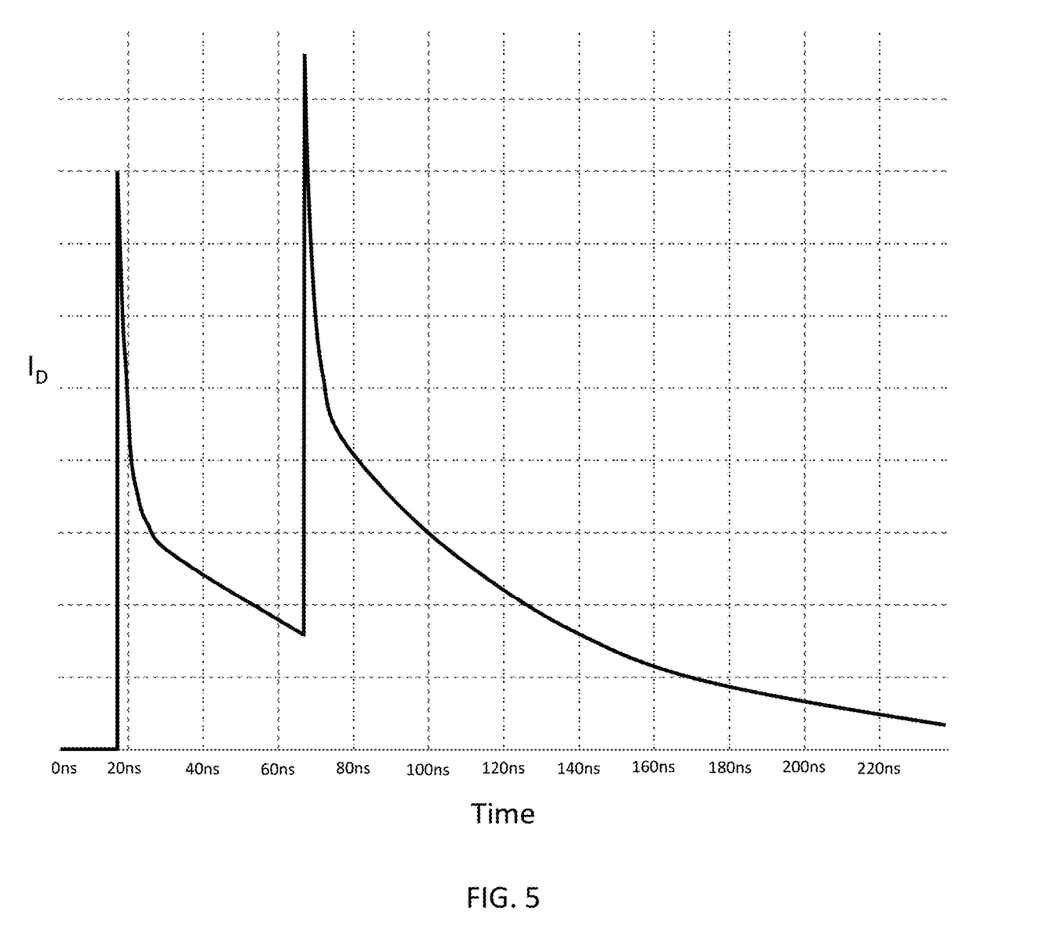
FIG. 5 shows the overlapping of uncompensated pulses.
Figure 6:
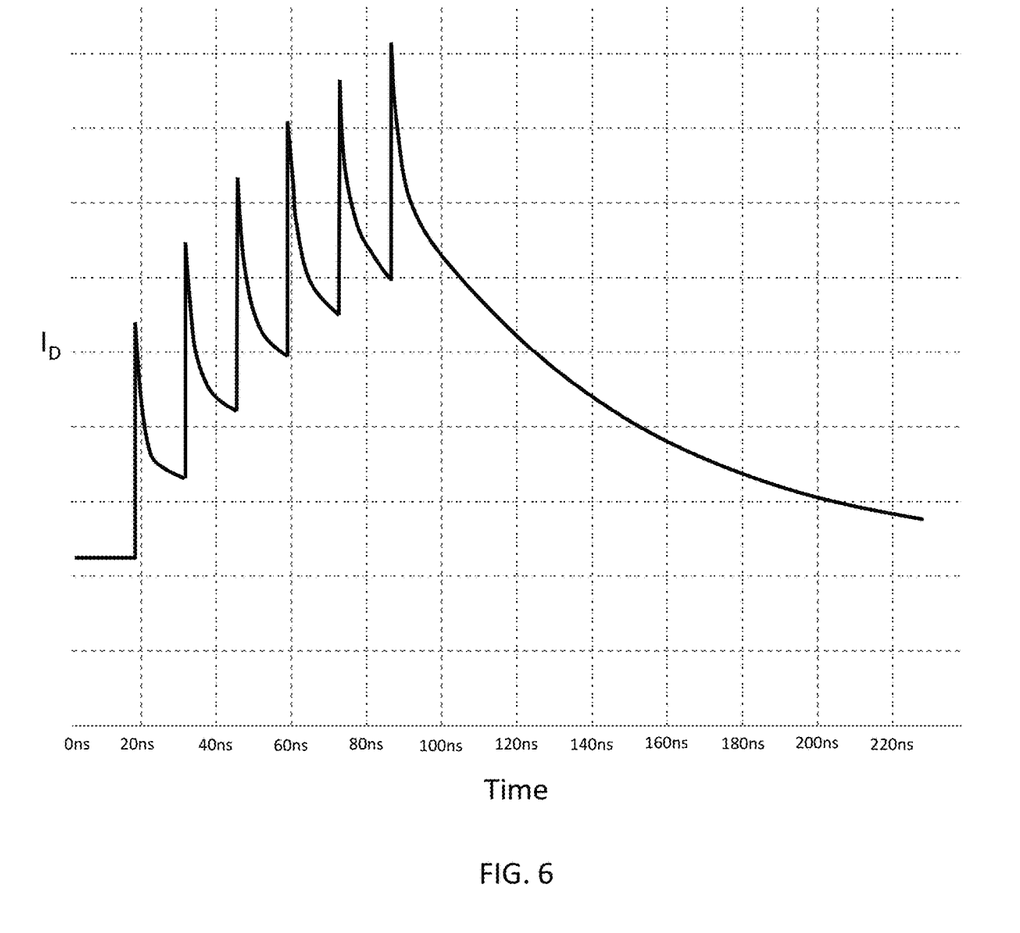
FIG. 6 shows many closely spaced photon events, and the increasing output pulse height.

This recovery time is reasonably consistent, but not exactly the same, for all the APD cells in the SiPM. Further when one or more SiPM APD cells are triggered during the recovery phase of the first cell, the output currents are the superposition sum of each SiPM cell response. There may be thousands to tens of thousands of cells in a SiPM device. In usage cases where there is ongoing photon flux, the first issue is that the overlap of the recovery period with subsequent SiPM APD cell pulses may occur during the recovery time of the first SiPM APD cell. The overlapping tail recovery of the first SiPM APD cell and the newly arriving photon at another SiPM APD cell will be additive in the final output response of the device making discrimination/measurement of individual photon-responses difficult as shown in FIG. 5. Commonly mitigation of this is done by adding a low pass filter to reduce the bandwidth lower than the recovery time, thus limiting the detection bandwidth. The second problem is in high photon flux periods the summing of many APD recovery tails quickly leads to saturation of the amplification system as shown in FIG. 6. In this scenario tail compensation methods that rely on active/amplified circuit tail time-constant compensation methods fail to produce a linear response.

One method to compensate for the tail response is to use a pole zero circuit (PZC) in the receiver signal conditioning (after or part of an amplification stage). This can significantly reduce the length of the recovery tail. This aids greatly the first issue and improves temporal resolution of the final usable signal out of the detector/amplifier system. Since the PZC is after the TIA stage, it suffers from non-linearities associated with amplifier saturation. This method also significantly relies on the precise matching of a PZC circuit to the tail time constant of the SiPM, which can be strongly influenced by temperature and device-to-device inconcinnities. The dynamic range and the precision of tail compensation of this technique are limited.

Therefore, there is long felt need for an inventive solution to solve the recovery time and amplifier saturation problems discussed above.

SUMMARY

Figure 7:
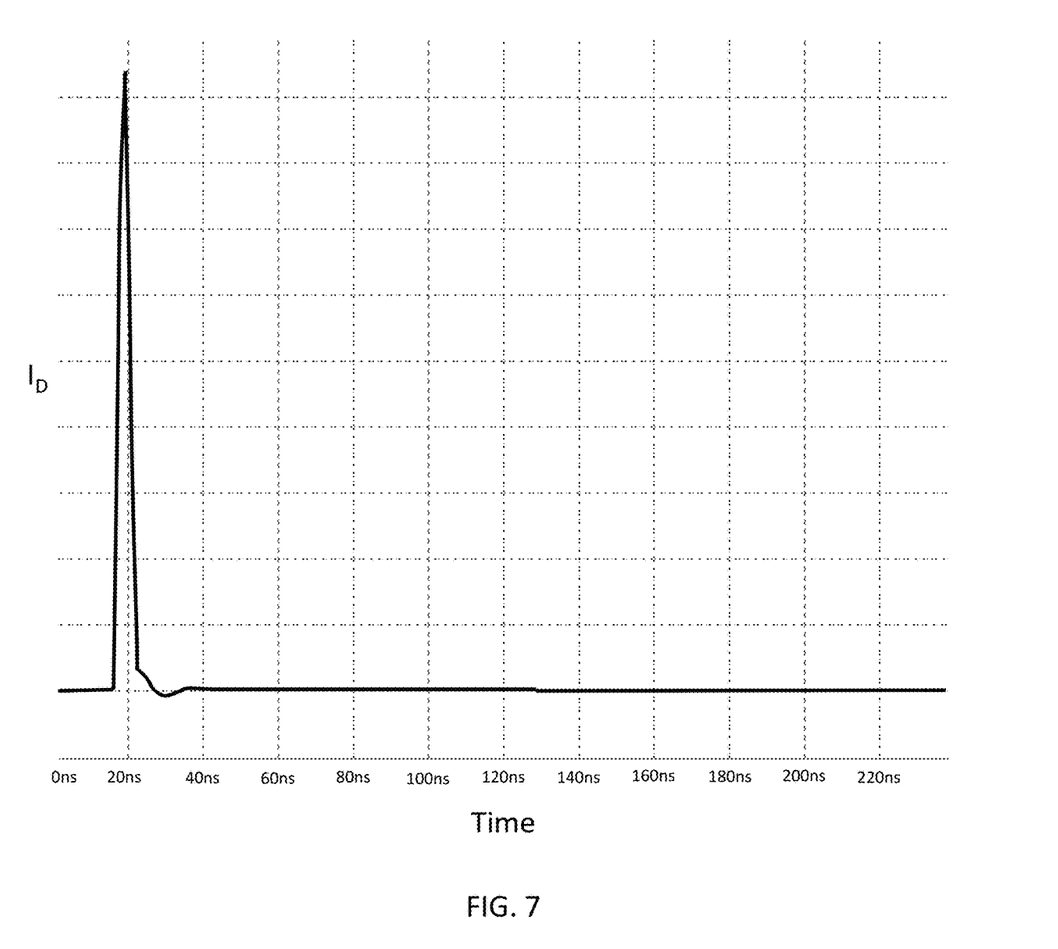
FIG. 7 shows the SiPM RPC compensated pulse response for a single photon event according to an embodiment.
Figure 8:
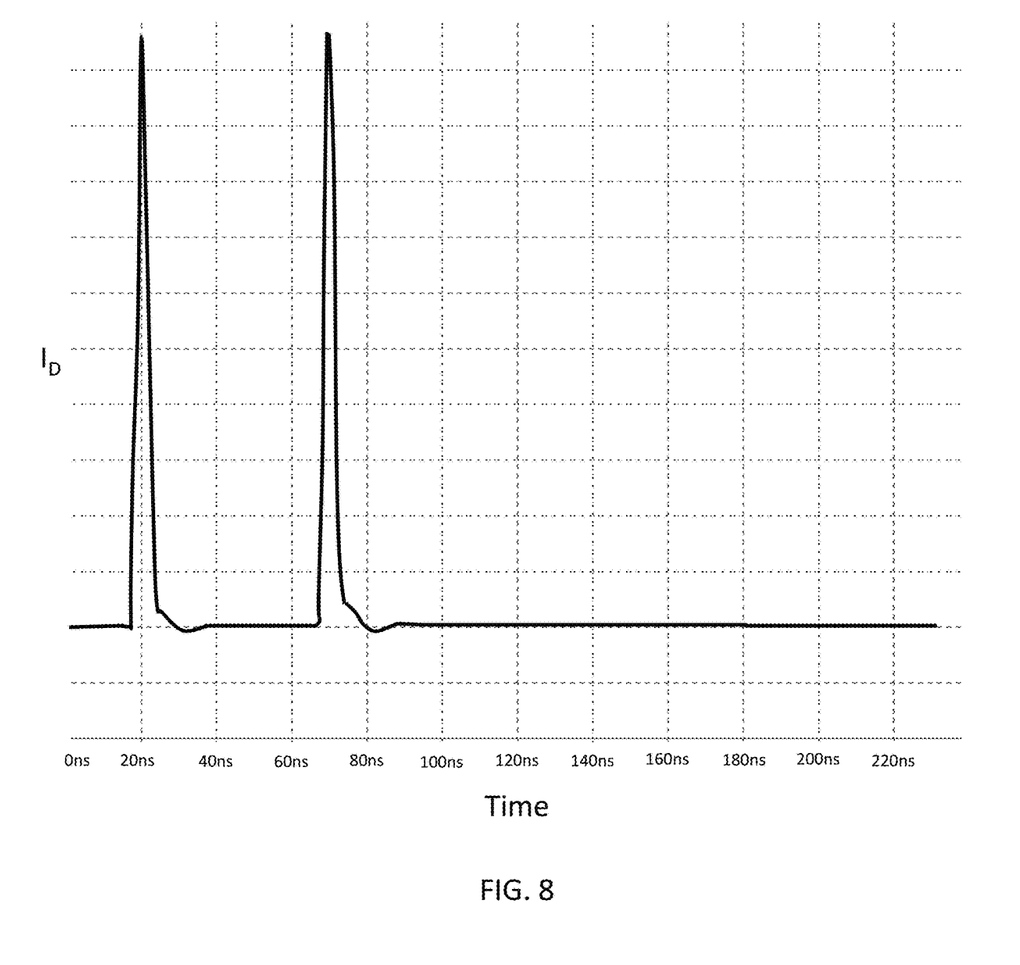
FIG. 8 shows the SiPM RPC compensated pulse response for 2 closely occurring photon events that overlap the recovery time of the first event according to an embodiment.
Figure 9:
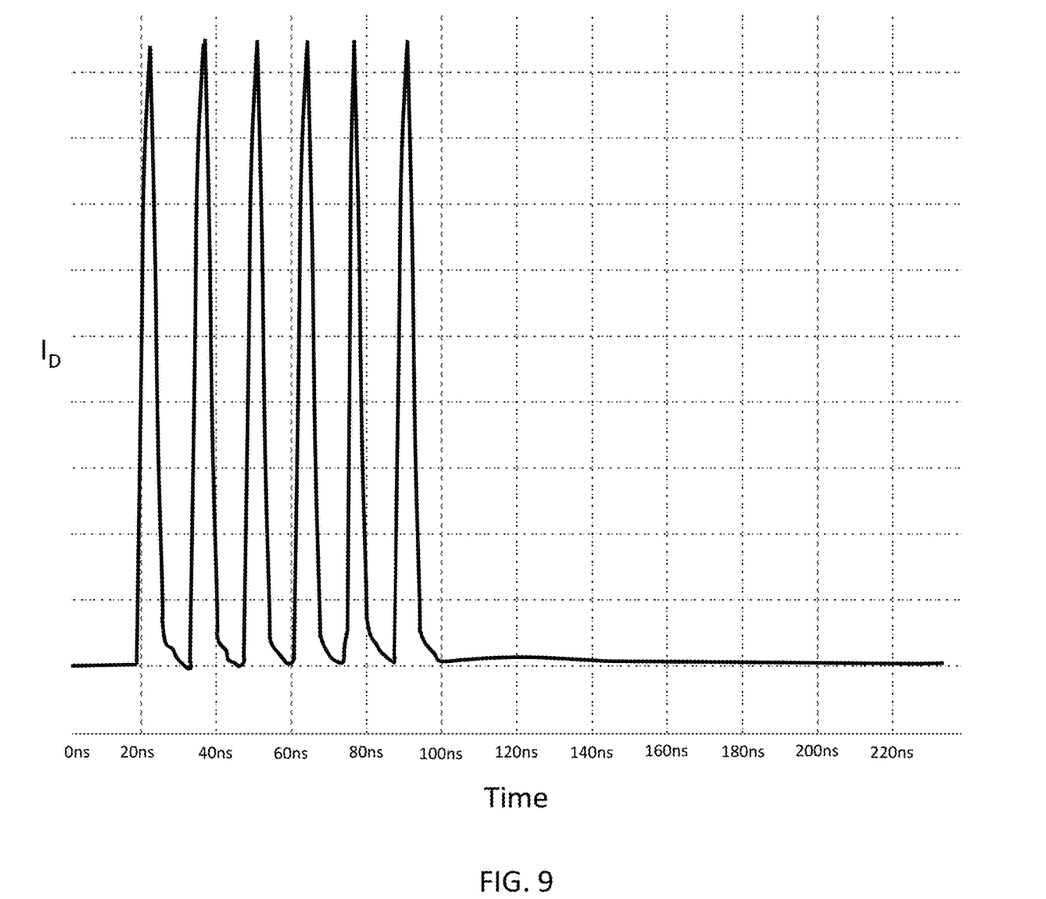
FIG. 9 shows many closely spaced photon events and the RPC compensated response according to an embodiment.

One embodiment of the present invention provides a photon detection device including: a silicon photomultiplier (SiPM) configured to generate a detected signal when the SiPM absorbs a photon; an amplifier; and a transmission line stub between the SiPM and amplifier input. The SiPM connection is configured to transmit the detected signal to the amplifier and a transmission line stub is also configured to receive the SiPM signal and generate a time-delayed reflected signal back into the amplifier input; wherein the amplifier is configured to amplify a combination of the detected signal and the time-delayed reflected signal. The end of the transmission line stub is terminated with a complex impedance that can simultaneously absorb some components of the SiPM pulse response, and reflect others. A preferable arrangement is for the fast-transient response is absorbed and not reflected (terminated in the characteristic impedance of the transmission line) and the slow tail response is reflected with a 180° phase (polarity inversion). The returning inverted slow tail will be subtracted from the SiPM tail at the amplifier input, thus cancelling and compensating the tail. The total time delay of the transmission line stub, in two directions, will determine the final output pulse width. An example output pulse shape of the described invention is shown in FIG. 7. A further example output for a series of closely spaced photon events using the reflective pulse compression (RPC) method is shown by the closely spaced, but uniformly high pulses in FIGS. 8 and 9.

One embodiment of the present invention provides a photon detection method including: generating, by a silicon photomultiplier (SiPM), a detected signal when the SiPM absorbs a photon; transmitting, via a circuit interconnect, the detected signal to an amplifier and to a transmission line stub; propagating through the transmission line delay; and then termination in a complex impedance at the end of the transmission line stub that is chosen to absorb and reflect certain components of the SiPM output pulse shape; a further propagation in the transmission line stub back toward the amplifier of advantageously chosen signal shape compensation; and amplifying a combination of the detected signal and reflected compensation signal.

DETAILED DESCRIPTION OF THE PREFERRED EMBODIMENTS

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Figure 10:
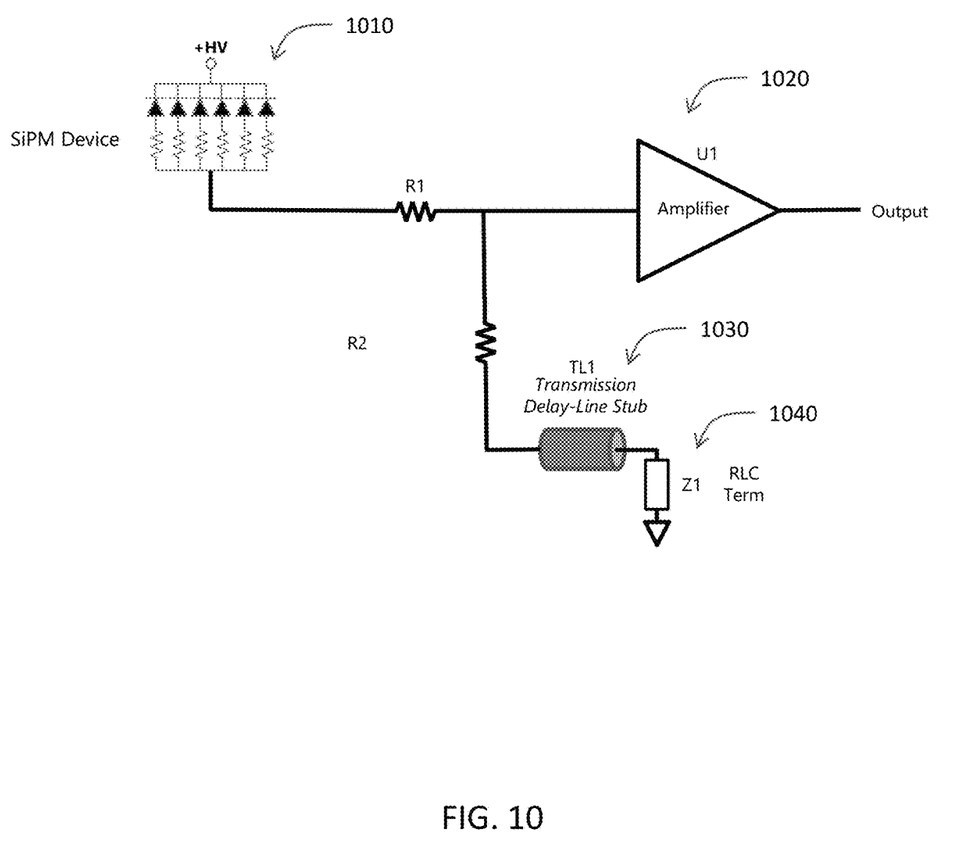
FIG. 10 is a block diagram of RPC circuit topology and amplifier according to an embodiment.

FIG. 10 shows the use of a stub to compress the recovery tail of the SiPM signal according to an embodiment. Photon signal detected by the SiPM 1010 is transmitted to the first amplification stage 1020 for signal amplification. The amplified signal is then further amplified and/or processed by a data processing unit. The detected signal travels along the transmission line and encounters a stub 1030 situated at a distance from an end of the transmission line. Part of the signal is reflected by the stub, and a combination of the detected signal and reflected signal enters the amplifier 1020 for amplification.

By using an almost shorted transmission line stub of appropriate length directly on the output of the SiPM, the recovery tail portion of the output can be subtracted from the SiPM prior to the first amplification stage. This SiPM reflective pulse compression process results in a narrower signal profile. The output from the SiPM with stub is a nearly symmetrical pulse that can be amplified appropriately and provide good temporal resolution on each photon as well as use the full dynamic range the SiPM is capable of.

FIG. 10 shows a simplified schematic diagram of the SiPM RPC photon detector according to an embodiment. The SiPM 1010 output current pulse propagates from the detector toward R1. Passing through R1 the propagating pulse is split, a portion propagating toward the amplifier, and another portion propagating into TL1 1030. The portion of the pulse traveling toward the amplifier 1020 is the incident rising edge of the pulse and reaches the amplifier input nearly instantaneously. The portion of the pulse traveling in TL1 takes a finite time to propagate to the termination Z1 1040. Z1 is designed to reflect and absorb different signal components in the pulse shape. In particular it will reflect nearly all of the slow tail portion of the SiPM pulse. This reflected tail is also phase shifted by 180° to effect an inversion. Inverted and nearly the same amplitude, this signal component travels back through TL1 toward the junction of R1 and R2 at the input of the amplifier. At the junction the signals are summed, with the inverted rail portion subtracting from the SiPM's original pulse, in effect compensating the tail response. R2 allows the level of the reflected tail to be precisely scaled such that it subtracts exactly from the forward propagating tail at the amplifier input. R1 functions to reduce effects of the SiPM parasitic elements on the reflected-and-returning signal at the end of TL1 that would otherwise load the returning pulse. The length of TL1 causes a time delay on the returning and reflected pulse. During this time delay the amplifier input receives the full rising edge of the incident SiPM output pulse. After the TL1 round-trip delay, the reflected pulse traveling back in TL1 toward the amplifier input will begin to subtract from the original SiPM output pulse, and cause the fast falling edge and tail compensation to result in a desirable final pulse shape. Note that the circuit components and their specific values are shown as an illustrative example. It is understood that the circuit components may be replaced by their respective equivalents and variations.

This circuit shows using an amplifier, but the SiPM with RPC would work equally well with a transimpedance amplifier (TIA), a low noise amplifier (LNA) are any suitable circuit that provides amplification. One advantage of this RPC topology is that many types of amplifiers can be used without significant restrictions (AC-coupled, DC-coupled, transimpedance, etc.). Note that the portion of this circuit after the output of the first amplifier U1 can be modified or redesigned by a skilled person based on specific needs.

Figure 11A:
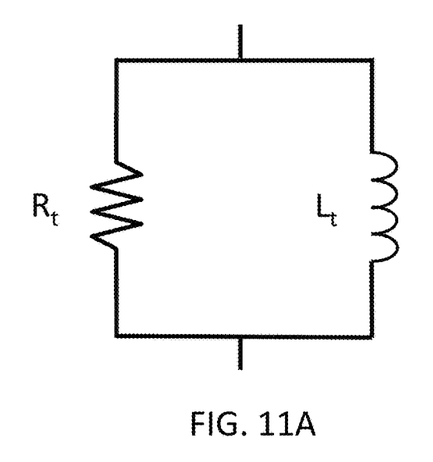
FIGS. 11A, 11B and 11C are example terminations according to some embodiments.
Figure 11B:
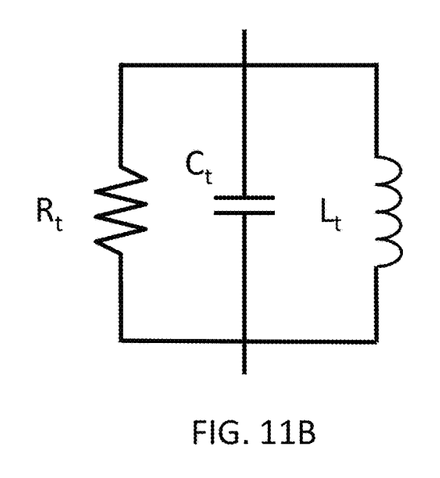
Figure 11C:
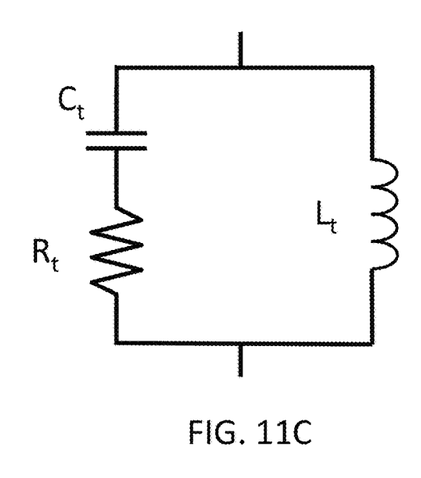

In one embodiment, the stub is terminated with a very low-impedance R∥L or RC∥L network, to appropriately shape the reflection and consequently the pulse shape. Example terminations are shown in FIGS. 11A-11C.

Note that the present circuit is not necessary to stay in a standard 50-Ohm impedance. An embodiment works with other termination impedances, which is important for some designs that have optimal noise with input resistance greater than 50 ohms.

Note that the transmission line TL1 may be implemented in many various ways, coaxial cable, PCB micro-strip, 2-wire cable, or may even be replaced by any delay-line device that provides signal propagation delay.

Figure 12:
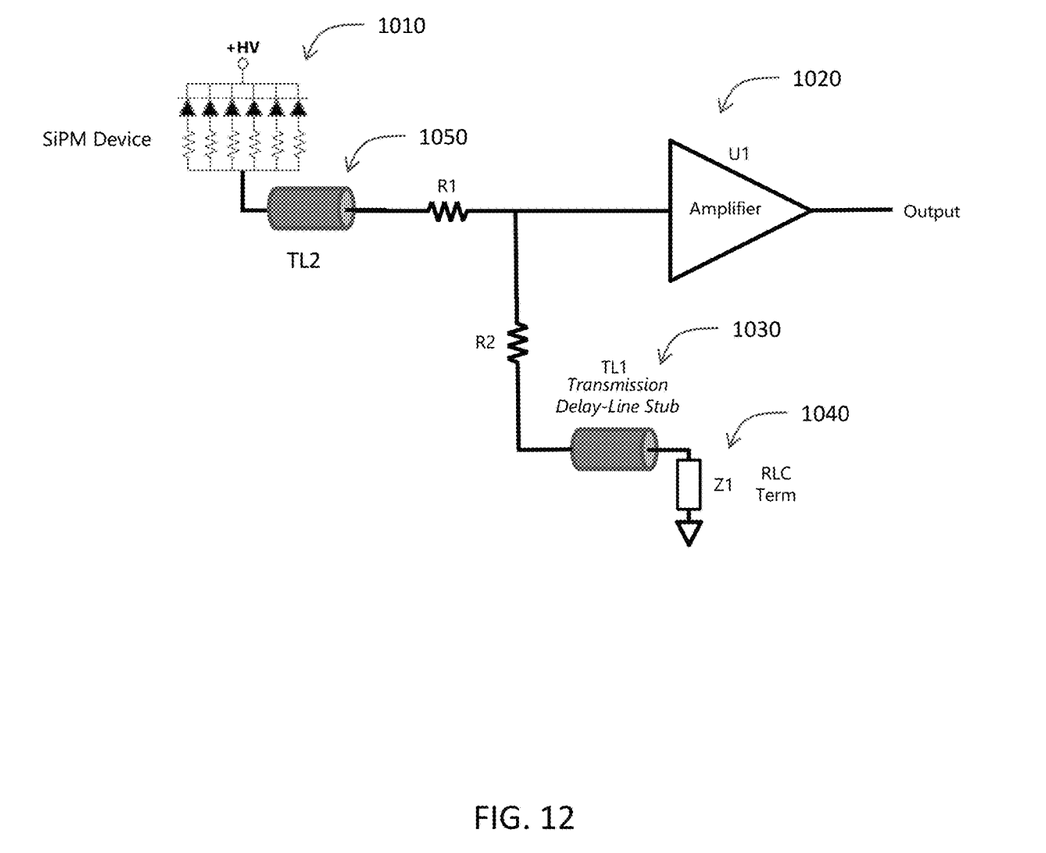
FIG. 12 shows a transmission line TL2 between a SiPM device and an amplifier U1/TL1 according to an embodiment.

The output of the SiPM may be connected to a transmission line TL2 1050 in place of or in addition to, before or after, R1 as shown in FIG. 12.

Figure 13:
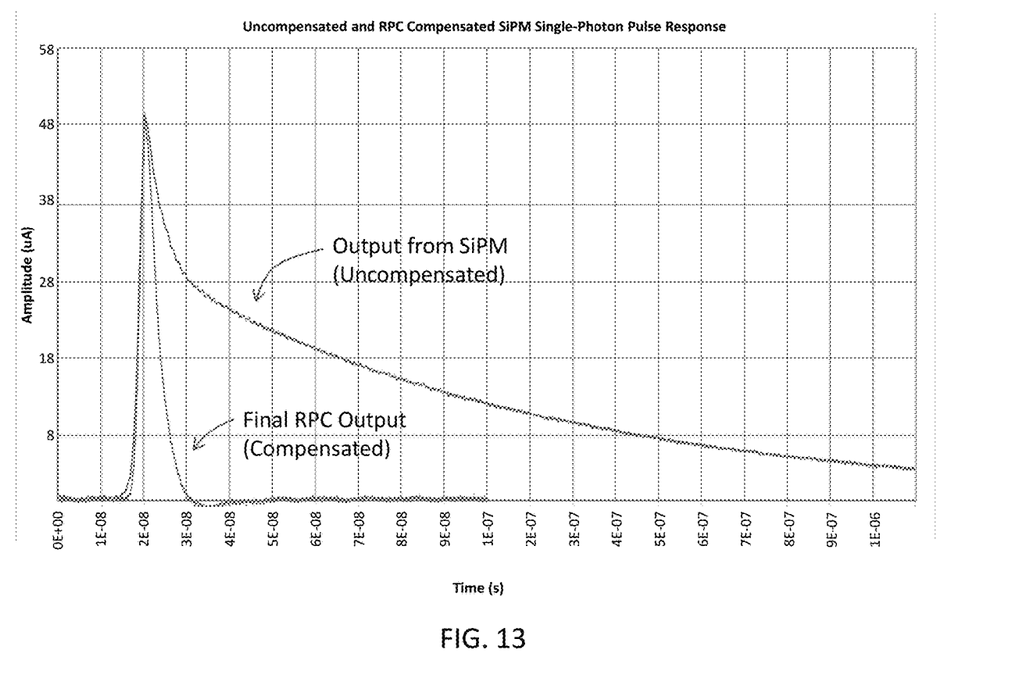
FIG. 13 shows waveform comparisons of uncompensated and compensated tail using RPC method according to an embodiment.

FIG. 13 shows the scope traces of the signals in a device according to an embodiment. FIG. 13 includes the output from the SiPM, and the final RPC output that is fed into the amplification system. Note that the combined signal has a very narrow tail and good temporal resolution.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A photon detection device comprising:
   a silicon photomultiplier (SiPM) configured to generate a detected signal when the SiPM absorbs a photon;
   an amplifier connected to the SiPM; and
   a transmission line stub between the SiPM and the amplifier;
   wherein the transmission line stub is configured to generate a reflected signal back into the SiPM-amplifier connection;
   wherein the amplifier is configured to amplify a combination of the detected signal and the reflected signal;
   wherein the transmission line stub is terminated with a complex impedance such that the reflected signal substantially subtracts a recovery tail portion of the detected signal from the SiPM, and
   the termination is comprised of R∥L or RC∥L circuits.

2. The photon detection device of claim 1, wherein a length of the transmission line stub is selected such that a time delay imposed on a reflected compensation waveform provides a suitably narrow final output pulse width.

3. The photon detection device of claim 1, wherein the transmission line stub is located at a selected distance along a transmission line such that a termination impedance is obtained for optimized performance of the amplifier.

4. A photon detection method comprising:
   generating, by a silicon photomultiplier (SiPM), a detected signal when the SiPM absorbs a photon;
   transmitting, via a transmission line, the detected signal to an amplifier, wherein the transmission line comprises a stub;
   reflecting, by the stub, a reflected signal to the transmission line;
   amplifying a summation of the detected signal and reflected signal; and
   terminating the stub with a complex impedance such that the reflected signal substantially subtracts a recovery tail portion of the detected signal from the SiPM, wherein the termination is comprised of R∥L or RC∥L circuits.

5. The photon detection method of claim 4, further comprising selecting a length for the stub such that a time delay imposed on a reflected compensation waveform provides a suitably narrow final output pulse width.

6. The photon detection method of claim 4, further comprising locating the stub at a selected distance along the transmission line such that a termination impedance is obtained for optimized performance of the amplifier.

* * * * *